(12) United States Patent
Ahn et al.

(10) Patent No.: US 6,989,573 B2
(45) Date of Patent: Jan. 24, 2006

(54) LANTHANIDE OXIDE/ZIRCONIUM OXIDE ATOMIC LAYER DEPOSITED NANOLAMINATE GATE DIELECTRICS

(75) Inventors: Kie Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/683,977

(22) Filed: Oct. 10, 2003

(65) Prior Publication Data

US 2005/0077519 A1  Apr. 14, 2005

(51) Int. Cl.
*H01L 29/76* (2006.01)
(52) U.S. Cl. .................................. 257/411; 257/310
(58) Field of Classification Search ................ 257/411, 257/532, 310
See application file for complete search history.

(56) References Cited

U.S. PATENT DOCUMENTS

| | | | | |
|---|---|---|---|---|
| 6,660,660 | B2 * | 12/2003 | Haukka et al. | 438/778 |
| 2004/0219746 | A1 * | 11/2004 | Vaartstra et al. | 438/240 |
| 2005/0077519 | A1 * | 4/2005 | Ahn et al. | 257/71 |

OTHER PUBLICATIONS

Jeon, Sanghun, et al., "Excellent Electrical Characteristics of Lanthanide Oxide and Lanthanide-doped Oxide for MOS Gate Dielectric Applications," IEEE, 2001, pp. 01-471 to474.
Kukli, Kaupo, et al., "Influence of thickness and growth temperature one the properties of zirconium oxide films grown by atomic layer deposition on silicon," Thin Solid Films 410, 2002, pp. 53-60.
Kukli, Kaupo, et al., "Dielectric Properties of Zirconium Oxide Grown by Atomic Layer Deposition from Iodide Precursor," Journal of The Electrochemical Society, vol. 148, No. 12, 2001.
Kukli, Kaupo, et al., "Properties of $Ta_2O_5$-Based Dielectric Nanolaminates Deposited by Atomic Layer Epitaxy," Journal of The Electrochemical Society, vol. 144, No. 1, 1997, pp. 300-306. Jan. 1997.
Kukli, Kaupo, et al., "Atomic layer deposition of zirconium oxide from zirconium tetraiodide, water and hydrogen peroxide," Journal of Crystal Growth, vol. 231, 2001, pp. 262-272.
Sneh, Ofer, "Thin film atomic layer deposition equipment for semiconductor processing," Thin Solid Films 402, 2002, pp. 248-261.
Zhang, H., "High permittivity thin film nanolaminates," Journal of Applied Physics, vol. 87, No. 4, 2000, pp. 1921-1924., Feb. 2000.

* cited by examiner

Primary Examiner—Mark V. Prenty
(74) Attorney, Agent, or Firm—Dorsey & Whitney LLP (57) ABSTRACT

The invention provides a laminated dielectric layer for semiconductor devices formed by a combination of $ZrO_2$ and a lanthanide oxide on a semiconductor substrate and methods of making the same. In certain methods, the $ZrO_2$ is deposited by multiple cycles of reaction sequence atomic layer deposition (RS-ALD) that includes depositing a $ZrI_4$ precursor onto the surface of the substrate in a first pulse followed by exposure to $H_2O/H_2O_2$ in a second pulse, thereby forming a thin $ZrO_2$ layer on the surface. After depositing the $ZrO_2$ layer, the lanthanide oxide layer is deposited by electron beam evaporation. The composite laminate zirconium oxide/lanthanide oxide dielectric layer has a relatively high dielectric constant and can be formed in layers of nanometer dimensions. It is useful for a variety of semiconductor applications, particularly for DRAM gate dielectric layers and DRAM capacitors.

120 Claims, 4 Drawing Sheets

LANTHANIDE OXIDE/ZIRCONIUM OXIDE ATOMIC LAYER DEPOSITED NANOLAMINATE GATE DIELECTRICS

TECHNICAL FIELD

The invention relates to the field of semiconductor dielectric layers, and particularly to dielectric layers used in the formation of transistor gates and capacitors in dynamic random access memory devices.

BACKGROUND OF THE INVENTION

Dynamic Random Access Memory Devices (DRAMs) have become the standard type of storage device in modern computer systems. Modern DRAMs are high density, highly integrated structures having a variety of configurations, most typically stacked and trench configurations. As ever increasing density is sought, more sophisticated manufacturing processes and materials are required to achieve sub micron sized electrical component layers with reliable conformity to operational specifications.

As density increases, the minimum feature sizes of DRAM components approach 100 nm and smaller. For example, the gate dielectric material thickness of MOS devices may be required to be 20 nm (200 Å) or less in certain designs. In this thickness range the most commonly used gate dielectrics, $SiO_2$, is not suitable because of leakage current caused by direct tunneling. As a result, gate dielectric materials with high dielectric constants (k) and large band gap with a favorable band alignment, low interface density, and good thermal stability are needed for future gate dielectric applications.

There are many known high-k unilaminate dielectric materials with high dielectric constants, such as $Ta_2O_5$, $TiO_2$ and $SrTiO_3$, but unfortunately these materials are not thermally stable when formed directly in contact with silicon. In addition, the interface of such materials need to be coated with a diffusion barrier, which not only adds process complexity, but also defeats the purpose of using the high-k dielectric. This added interfacial layer becomes a series capacitor to the gate capacitance, and degrades the high capacitance. Moreover, materials having too high or too low a dielectric constant may not be an adequate choice for alternate gate applications. Ultra high-k materials such as $SrTiO_3$ may cause fringing-field induced barrier lowering effect. On the other hand, materials with relatively low dielectric constant such as $Al_2O_3$ and $Y_2O_3$ do not provide sufficient advantage over the $SiO_2$ or $Si_3N_4$.

Lanthanide oxides have also been investigated as possible dielectric materials for use in gate dielectric oxides. Jeon et al reported an investigation of the electrical characteristics of amorphous lanthanide oxides prepared by electron beam evaporation and sputtering (Jeon et al., *Technical Digest of Int'l Electron Devices Meetings*, 471–474, 2001). Excellent electrical characteristics were found for the amorphous lanthanide oxides including a high oxide capacitance, low leakage current, and high thermal stability. Typical dielectric constants ranged between 11.4 and 15.0 in thin samples. Accordingly, lanthanide oxides alone may be a suitable alternative for certain applications using single layers of dielectric material. Also, a single layer of $ZrO_2$ may be used in certain applications. Recently, a zirconium oxide layer formed by atomic layer deposition (ALD) from an iodide precursor was shown to have exhibit a relative permititivity at 10 kHz of about 23–24 for films deposited at 275–325° C. (Kukli et al, *Thin Solid Films* 410, 53–56 (2003)).

An alternative configuration for gate electrode dielectric layers is a composite laminate dielectric layer made of two or more layers of different materials. Thin (about 10 nm) nanolaminate dielectric materials made of layers of tantalum oxide and hafnium oxide ($Ta_2O5$-$HfO_2$), tantalum oxide and zirconium oxide ($Ta_2O_5$—$ZrO_2$) or zirconium oxide hafnium oxide ($ZrO_2$—$HfO_2$) deposited on a silicon substrate by ALD were characterized for possible gate dielectric applications by Zhang et al, *J. App. Physics*, 87 (4) 1921–1924 (2000). The dielectric constants of these films were in the range of 12–14 and the leakage currents were in the range of $2.6 \times 10^{-8}$ to $4.2 \times 10^{-7}$ A/cm at 1.0 MV/cm$^{-2}$ electric field.

The ALD method of forming layers is also known as "alternately pulsed chemical vapor deposition." ALD was developed as a modification of conventional CVD techniques. While there are a variety of variations on ALD, the most commonly used method is reaction sequence ALD (RS-ALD). In RS-ALD, gaseous precursors are introduced one at a time to the substrate surface in separate pulses. Between pulses, the reactor is purged with an inert gas or is evacuated. In the first reaction step, the precursor is saturatively chemi-adsorbed at the substrate surface, and during the subsequent purging step, free precursor is removed from the reactor. In the second step, another precursor is introduced on the substrate and the desired film growth reaction takes place on the substrate surface. When the chemistry is favorable, the precursors adsorb and react with each other aggressively forming the film. Subsequent to film growth, the by-products and excess precursors are finally purged from the reactor. One advantage of RS-ALD is that one cycle of first precursor depositing, purging, second precursor depositing, reaction, and final purging can be performed in less than one second in a properly designed flow type reactor.

One striking feature of RS-ALD is the saturation of all the reaction and purging steps, which makes the growth self-limiting. This allows for large area uniformity and conformality to planar substrates and deep trenches, even in the extreme cases of porous silicon or high surface area silica and alumina powders. The control of film thickness is straight forward and can be made by simply calculating the growth cycles. ALD was originally developed to manufacture luminescent and dielectric films needed for electroluminescent displays where much effort was put to the growth of doped zinc sulfide an alkaline earth metal sulfide films. Later ALD was studied for the growth of different epitaxial composite II–V, and II–VI films, nonepitaxial crystalline or amorphous oxide and nitride firms in composite multiplaner structures. Unfortunately however, although considerable effort was put into use of ALD for growth of silicon and germanium films, difficult precursor chemistry precluded success in this area.

There is therefore a need in the art to provide other types of composite laminate dielectric layers, particularly using the favorable features of RS-ALD deposition methods.

SUMMARY OF THE INVENTION

The present invention provides semiconductor devices that include a substrate material and a composite laminate dielectric layer formed on the substrate material. The composite laminate dielectric layer includes a layer of $ZrO_2$ and a layer of a lanthanide oxide formed on the $ZrO_2$ layer. Alternatively, the composite laminate dielectric layer includes the layer of $ZrO_2$ formed on the layer of lanthanide oxide. In general embodiments, the lanthanide oxide layer may be made of any one of $Pr_2O_3$, $Nd_2O_3$, $Sm_2O_3$, $Gd_2O_3$, $Dy_2O_3$ and PrTixOy, where x and y are variable, typically in a ratio of 1.0 x to 0.9–1.0 y.

In certain embodiments, the composite laminate dielectric layer is a gate dielectric layer of a MOS transistor. In other embodiments, the composite laminate dielectric layer is a dielectric insulating layer of a semiconductor capacitor. Other embodiments include MOS gate dielectric layers, semiconductor capacitors and DRAMs having one or more of the composite laminate dielectric layers made of the $ZrO_2$ layer and the lanthanide oxide layer. In certain embodiments for a transistor gate electrode dielectric, the $ZrO_2$ layer has a thickness of between about 1 to about 6 m and the lanthanide oxide layer has a thickness of about 2 to 12 nm. In various embodiments, the $ZrO_2$ layer is formed on a substrate by RS-ALD from a $ZrI_4$ precursor and an oxygen precursor, typically $H_2O/H_2O_2$, and the lanthanide oxide layer is formed by electron beam evaporation of a lanthanide oxide.

In another aspect, the invention includes methods of forming a composite laminate dielectric layer for a semiconductor device, that includes the steps of depositing a layer of $ZrO_2$ on a silicon substrate and depositing a layer of lanthanide oxide on the $ZrO_2$ layer or vice versa. In one embodiment, the $ZrO_2$ oxide layer is formed by RS-ALD from a $ZrI_4$ precursor. In another embodiment, the lanthanide oxide layer is formed by electron beam evaporation of a lanthanide oxide. In still another embodiment, the $ZrO_2$ layer is formed RS-ALD of $ZrI_4H_2O/H_2O_2$ precursors, and the lanthanide oxide layer is formed by electron beam evaporation of a lanthanide oxide.

Another aspect of the invention is a system for forming the foregoing composite laminate dielectric layers on a substrate. The system includes a first reaction vessel configured for depositing a layer of $ZrO_2$ on a silicon substrate and a second reaction vessel configured for depositing a layer of lanthanide oxide on the $ZrO_2$ layer. In certain embodiments, the first reaction vessel is configured for depositing the $ZrO_2$ layer by RS-ALD and the second reaction vessel is configured for depositing the lanthanide oxide layer by electron beam evaporation. The system also includes means for transporting the substrate between the first and the second reaction vessels.

DETAILED DESCRIPTION OF PREFERRED EMBODIMENTS

In setting forth the invention in detail, citation is made to various references that may aid one of ordinary skill in the art in the understanding or practice of various embodiments of the invention. Each such reference is incorporated herein by reference in its entirety, including the references that may be cited in the incorporated references to the extent they may required to practice the invention to its fullest scope. The drawings provided herein are not to scale nor do they necessarily depict actual geometries of the devices of the invention. Rather, the drawings are schematics that illustrate various features of the invention in a manner readily understood by one of ordinary skill in the art, who can make actual devices based on these drawings and the description that follows.

Figure 1:
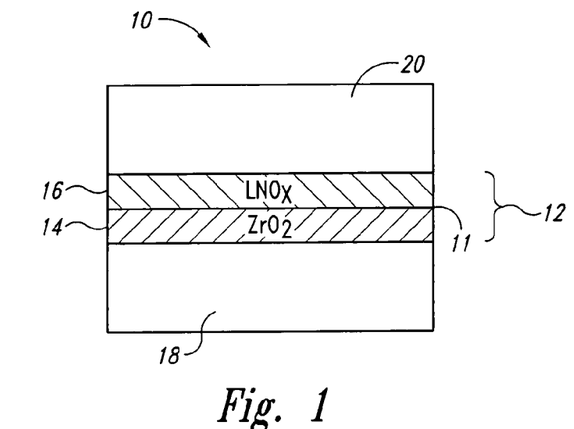
FIG. 1 is a partial cross-sectional drawing of a general embodiment of semiconductor device having a composite laminate dielectric layer according to one embodiment of the invention.

FIG. 1 depicts a general embodiment of the invention, which includes a semiconductor device 10 that includes a composite laminate dielectric layer 12 made of a $ZrO_2$ first layer 14 laminated to a lanthanide oxide second layer 16. The lanthanide oxide layer 16 may be made of any lanthanide oxide, for example, $Pr_2O_3$, $Nd_2O_3$, $Sm_2O_3$, $Gd_2O_3$, $Dy_2O_3$ or PrTixOy or $ZrO_2$. As used herein, the term "laminated" means the first and second layers each have a surface in physical contact with one another. Typically the $ZrO_2$ layer 14 and lanthanide oxide layer 16 are annealed, alloyed or otherwise physically bonded to one another at the interface 11 of the layers by deposition techniques. In various embodiments, the thickness of the composite laminate dielectric layer combining both the $ZrO_2$ layer 14 and the lanthanide oxide layer 16 is less than 1000 nm, less than 500 nm, less than 100 nm, less than 50 nm, less than 20 nm, less than 10 nm, or less than 5 nm. Because the composite laminate dielectric layer 12 has nanometer dimensions, it may be referred to as a nanolaminate dielectric material.

Typically, the composite laminate dielectric layer 12 is positioned between a first conductive layer 18 and a second conductive layer 20 of the semiconductor device 10. The first conductive layer 18 or the second conductive layer 20 may each be a semiconductor or a metal in certain embodiments, or one may be a semiconductor and the other may be a metal in other embodiments.

The relative thickness of the $ZrO_2$ layer 14 and the lanthanide oxide layer 16 can be varied. In one embodiment, where the composite laminate dielectric layer 12 may be used for a MOS component, for example, as a gate dielectric, the lanthanide oxide layer 16 may be equal in thickness to the $ZrO_2$ layer 14, or alternatively, the lanthanide oxide layer 16 may be up to 5 times the thickness of the $ZrO_2$ layer 14. In embodiments where the composite laminate dielectric layer 12 is used for other devices, the relative thickness of the $ZrO_2$ layer 14 and the lanthanide oxide 16 can be varied according to need. The lanthanide oxide layer 16 has a dielectric constant of about 11.4–15 while the $ZrO_2$ material used for the $ZrO_2$ layer 14 has a dielectric constant of about 23–25. The composite laminate dielectric layer 12, therefore, will have a dielectric constant between about 12 and 24 depending on the relative thickness of the layers used.

One of ordinary skill in the art can readily select the relative thickness of layers to use according to need. The "equivalent oxide thickness" (EOT) measurement, sometimes simply called "oxide equivalent," is a convenient measure of the relative capacitance of any dielectric layer of a given thickness relative to the thickness that might be required in any given application. The EOT of a dielectric layer is calculated by dividing the thickness of the layer by its silicon oxide dielectric ratio. The silicon dioxide dielectric ratio is the dielectric constant of the subject material divided by the dielectric constant of silicon dioxide. The dielectric constant of silicon dioxide is about 4. Accordingly, the silicon oxide dielectric ratio for $ZrO_2$ is about 6 (viz, 5.75–6.25) and for lanthanide oxide is about 3 (viz, 2.85–3.75). Therefore, for example, a 3 nm $ZrO_2$ layer 14 has an EOT about 0.5 nm (i.e., 3 divided by 6) while a 3 nm lanthanide oxide layer 16 has an EOT of about 1 nm. The EOT of a composite laminate dielectric layer 12 made of a 3 nm of $ZrO_2$ layer 14 and a 3 nm lanthanide oxide layer 16 would be the sum of the oxide equivalents for each layer, or about 1.5 nm.

One factor to consider in selecting the relative thickness of layers to use is roughness of the $ZrO_2$ layer 14. The $ZrO_2$ layer 14 has a smooth, cubic $ZrO_2$ crystalline structure (c-$ZrO_2$) within the first 5 nm when deposited by RS-ALD as describe hereafter. This smooth structure transitions to a more rough, tetragonal crystalline structure (t-$ZrO_2$) as the layer is made thicker. Accordingly, in high density embodiments, such as in MOS gate dielectric layers where a relatively smooth $ZrO_2$ layer is desirable, the $ZrO_2$ layer 14 should be less than about 5 nm in thickness. In capacitor applications where the smoothness of the $ZrO_2$ layer is less critical, the $ZrO_2$ layer 14 can be made thicker than the lanthanide oxide layer 16 to achieve a higher dielectric constant.

Figure 2:
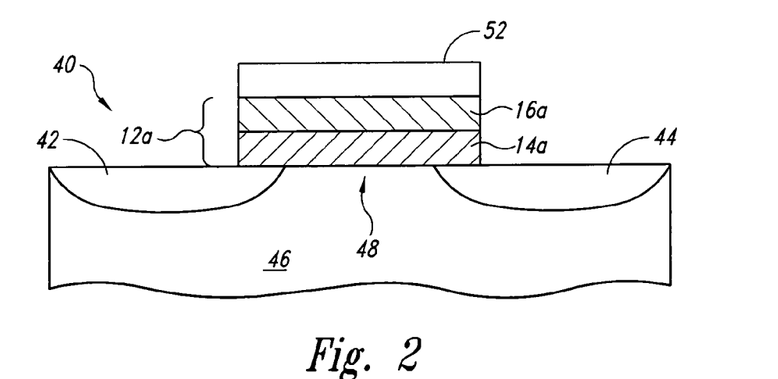
FIG. 2 is a partial cross-sectional drawing of a general embodiment of a MOS transistor having the composite laminate dielectric layer according to another embodiment of the invention.

As mentioned above, one embodiment of the invention is a MOS transistor made with the composite laminate dielectric layer 12 for the gate dielectric. FIG. 2 is a cross-sectional view of a general MOS transistor 40 exemplifying one such embodiment of invention. The transistor 40 includes conventional doped silicon semiconductor source/drain regions 42 and 44, which are disposed in a substrate 46 a gate electrode 52, and a gate dielectric layer 12a. As is well known, when a sufficient voltage is applied to the gate electrode 52, a conductive channel region 48 disposed in the substrate 46 between the source/drain regions 42 and 44 is formed. The MOS transistor 40 of the invention has a gate dielectric layer 12a made of the composite laminate dielectric layer 12, which includes the $ZrO_2$ layer 14 and the lanthanide oxide layer 16. The thickness of the $ZrO_2$ layer 14 is about 1–6 nm, in various embodiments, and typically about 3 nm or about 6 nm. The thickness of the lanthanide oxide layer 16 in these embodiments is about 2–12 nm. The thickness of the composite laminate dielectric layer 12 is therefore about 3 to 18 nm, and more typically about 4–15 nm.

Figure 3:
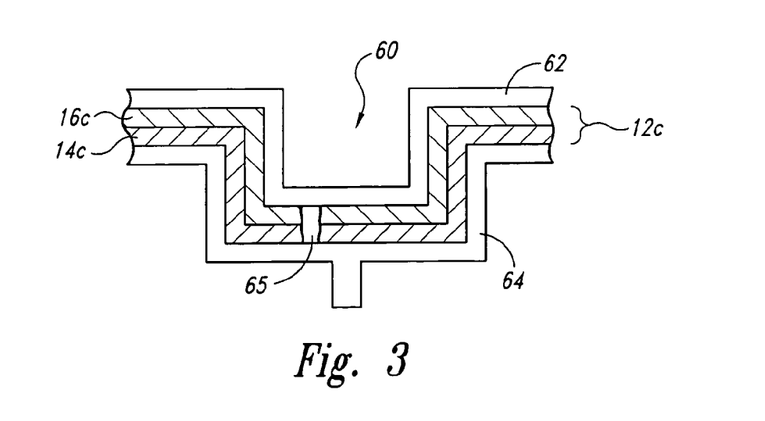
FIG. 3 is a partial cross-sectional drawing of a general embodiment of semiconductor capacitor transistor having the composite laminate dielectric layer according to another embodiment of the invention.

FIG. 3 is a cross-sectional view of a semiconductor capacitor 60 according to another embodiment of the invention. As appreciated by one of ordinary skill in the art, the capacitor 60 can be used in a semiconductor memory cell, for example, in a DRAM. The capacitor 60 includes a conventional electrode 62, which is formed from a conductive material such as a metal, polysilicon or doped polysilicon. The electrode 62 is adjacent to one side of the composite laminate dielectric layer 12c which is formed of the $ZrO_2$ layer 14c and the lanthanide oxide layer 16c. Another electrode 64 is adjacent to another side of the composite laminate dielectric layer 12c. In a DRAM memory cell application, the electrode 64 can be coupled to an access device, such as a transistor. The thickness of the $ZrO_2$ layer 14 is about 1–6 nm, in various embodiments, and typically about 3 nm or about 6 nm. The thickness of the lanthanide oxide layer 16 in these embodiments is about 2–12 nm. The thickness of the composite laminate dielectric layer 12 is therefore about 3 to 18 nm, and more typically about 4–15 nm.

Figure 4A:
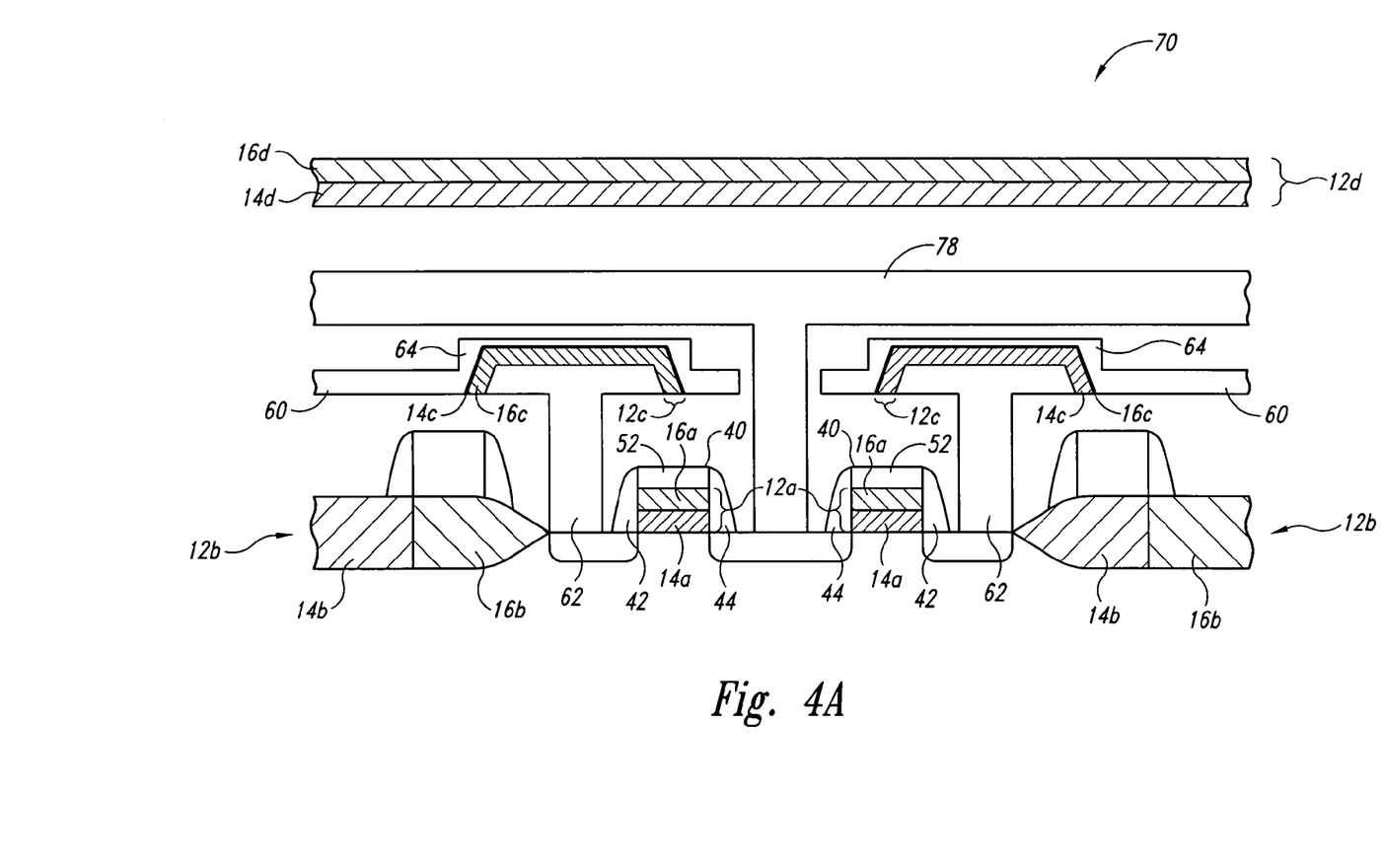
FIGS. 4A and 4B are partial cross-sectional drawings of exemplary embodiments of memory cells, having one or more composite laminate dielectric layers according to another embodiment of the invention.
Figure 4B:
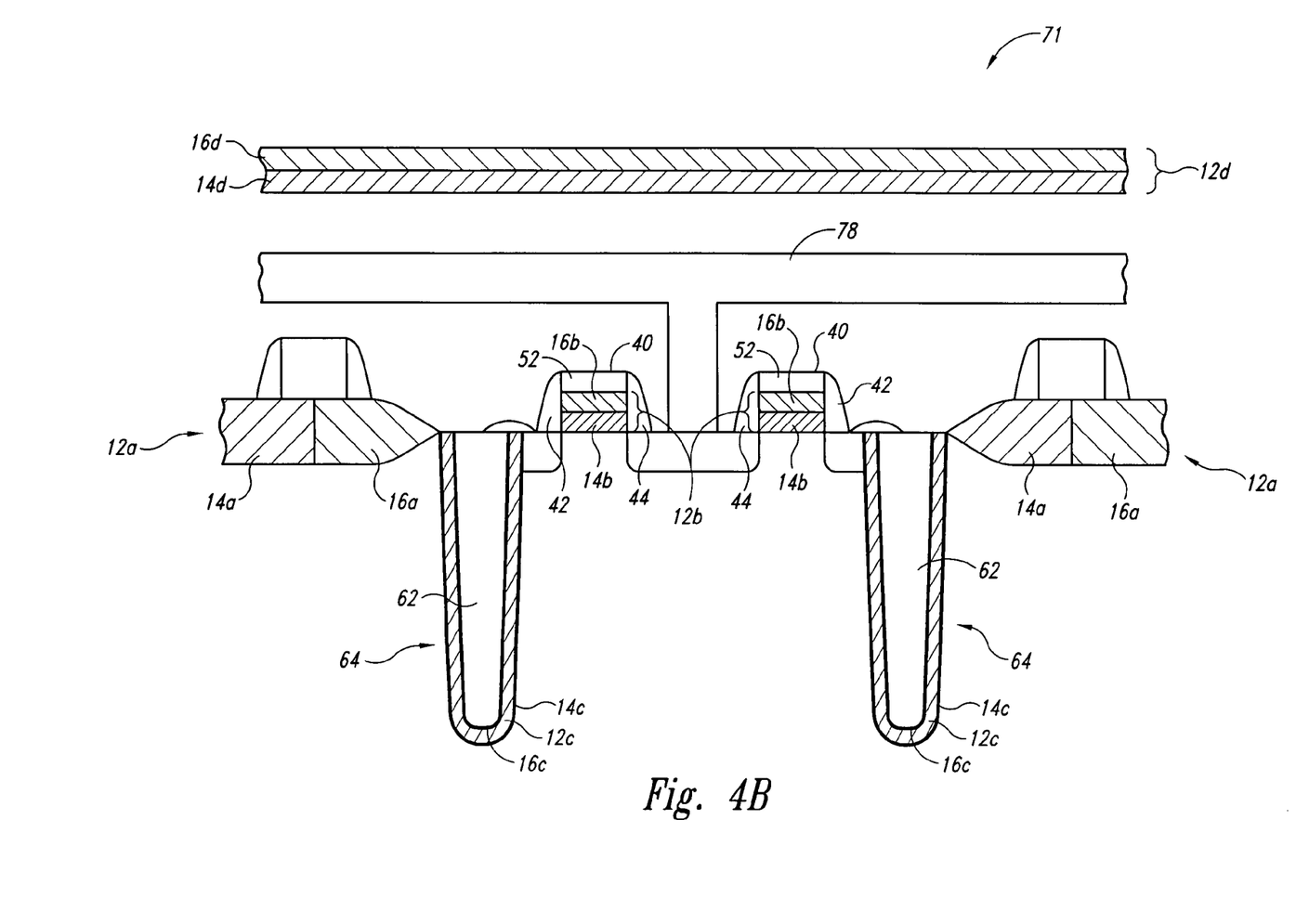

FIGS. 4A and 4B are diagrams that depict other embodiments of the invention, which include memory cells that contain one or more composite laminate dielectric layers. FIGS. 4A and 4B illustrate pairs of stacked 70 and trench type 71 DRAM memory cells, respectively. The DRAMS include capacitors 60 comprised of the storage electrodes 62 and the plate electrodes 64. The storage electrodes 62 and plate electrodes 64 can be made of any conductive or semiconductive material. Typically, the storage electrodes 62 and the plate electrodes 64 are made of polycrystalline or crystalline silicon, a refractory metal such as W, Mo, Ta, Ti or Cr, or suicides thereof such as $WSi_2$, $MoSi_2$, $TaSi_2$ or $TiSi_2$. Other metals or metal silicides may be used in various designs. It will be appreciated that the electrodes 62 and 64 may be made from still other materials without departing from the scope of the invention. In certain embodiments, in the DRAM, the storage electrodes 62 and the plate electrodes 64 of the capacitor 60 are separated by the composite laminate dielectric layer 12c that includes the $ZrO_2$ layer 14c and the lanthanide oxide layer 16c.

The capacitor 60 is used to store charge representing one bit of data. Access to the capacitor is made via a wordline 52 and digitline 78. The wordline 52 is the gate electrode 52 of the transistor 40 that is used to form a conductive channel between source/drain regions 42 and 44 when sufficient voltage is applied to the wordline 16. In certain embodiments of the DRAMS of the invention, the gate electrode 52 is located above the gate dielectric layer 12a made of composite laminate gate dielectric material 12, having the $ZrO_2$ layer 14a and the lanthanide oxide layer 16a.

As depicted in FIGS. 4A and 4B, the composite laminate dielectric layer 12 is used as both the gate dielectric 12a as well as the capacitor dielectric 12c. Although depicted for use as both the gate dielectric 12a and the capacitor dielectric 12c, it will be appreciated that the composite laminate dielectric layer 12 may be used in only one of such locations, both locations or in other locations in a DRAM where a dielectric may be used.

Although the $ZrO_2$ layer 14 and lanthanide oxide layer 16 in the embodiments shown in the foregoing Figures are depicted with the $ZrO_2$ layer 14 positioned below the lanthanide oxide layer 16, the relative position of the layers can be reversed in various applications. The order of placement of the layers depends on the particular fabrication process for the semiconductor device and relative position of the layers with respect to other components of the device. In certain embodiments, the $ZrO_2$ layer 14 can be formed first by depositing the $ZrO_2$ onto and approriate surfaces by one of the RS-ALD deposition methods described herein after. Alternatively, in other embodiments, the lanthanide oxide layer 16 can be deposited first, using for example, the e-beam deposition method described herein after. In most embodiments, the $ZrO_2$ layer 14 will be deposited first because the thickness of this layer can easily be controlled by the number of cycles used in the RS-ALD and typically forms a smooth surface on polysilicon, crystalline silicon, or other substrates.

Another aspect of the invention includes methods of forming a semiconductor structure that include forming the composite laminate dielectric layer 12 by forming the $ZrO_2$ layer 14 and then forming the layer of lanthanide oxide 16 on the surface of the $ZrO_2$ layer 14, or vice versa.

There are a variety of methods of depositing the $ZrO_2$ layer used in various embodiments of the invention. One embodiment uses DC magnetron-reactive-sputtering from a Zr target in an Ar+$O_2$ ambient atmosphere with an $O_2$ flow rate of 2 sccm and total pressure of 40 mTorr, as described by for example, by Wen-Jie Qi, et al, *Technical Digest of IEDM*, 145, 1999. The sputtering may be done at different temperatures and at different power levels. After sputtering, the samples are furnace annealed in either an $O_2$ or an $N_2$ ambient atmospheres. The $ZrO_2$ films deposited using this technique are amorphous and form a thin interfacial silicate layer of about 9 Å thickness. This interfacial layer can be minimized through optimization of process parameters such as power and temperature. There is no significant inter-diffusion between $ZrO_2$ and Si. After high temperature annealing, the layer grows and converts to a more stoichiometric $ZrO_2$ layer.

Another method for depositing the $ZrO_2$ layer 14 in certain embodiments is atomic layer chemical vapor deposition (AL-CVD) as described for example by M. Copel, et al, *Appl. Phys. Lett.*, 76, 436, 2000. Films of $ZrO_2$ are grown using alternating surface saturation reactions of $ZrCl_4$ and $H_2O$ at about 300° C. After film growth, the substrates may be transferred in air to a characterization system where they are treated to in situ annealing under ultra high vacuum or to oxidizing in a stainless-steel turbo-pumped side chamber. In certain practices, prior to deposition, a 15 Å thick $SiO_2$ layer may be grown by thermal oxidation in a separate furnace. In these practices, samples can be treated to dilute 5% HF for 2 min prior to AL-CVD growth of the $ZrO_2$ layer 14 to remove the $SiO_2$. It should be noted, however, that attempts to grow $ZrO_2$ directly on HF stripped silicon, without prior silicon oxide oxidation may result in uneven and discontinuous $ZrO_2$ films.

Another technique for depositing the $ZrO_2$ layer 14 in certain embodiments, is a pulsed-laser-ablation deposition method as described for example, by Yamaguchi et al. *Solid State Devices and Materials*, 228–229, 2000. Ultra-thin $ZrO_2$ layers having a large dielectric constant and a smooth interface can be formed using this technique.

Another technique for depositing the $ZrO_2$ layer 14 used in other embodiments, is in-situ rapid thermal processing as described, for example, by H. Lee et al, *IEDM* 2000, 27–30, 2000. Lee et al. reported the MOS characteristics of ultra thin, high quality CVD $ZrO_2$ and Zr silicate ($Zr_{27}Si_{10}O_{63}$) gate dielectrics deposited on silicon substrates by this method. These high-k gate dielectrics showed an excellent EOT of 8.9 Å ($ZrO_2$) and 9.6 Å ($Zr_{27}Si_{10}O_{63}$) with extremely low leakage current of 20 mA/$cm^2$ and 23 mA/$cm^2$ at Vg=−1 V, respectively.

Yet another method for depositing the $ZrO_2$ layer 14 in other embodiments, is Jet-Vapor-Deposition (JVD), as described, for example, by Z. J. Luo et al., 2001 *Symposium on VLSI Technology Digest of Technical Papers*, 135-13 Luo et al. demonstrated that films with EOT of 1 nm possess high thermal stability, low leakage, high reliability and other good electrical properties. The composition of JVD films varies with thickness. Thinner films are found to be Zr silicate-like whereas thicker films are likely graded with a transition to stoichiometric $ZrO_2$. In addition, these films were found to survive annealing temperatures as high as 1000° C.

Still another method for forming a $ZrO_2$ layer 14 in other embodiments, is to use a modification of the low temperature oxidation method for forming a silicon oxide layer described, for example, by Saito et al. which uses oxygen generated in a high-density krypton plasma ("*Extended Abstracts of the* 1999 *International Conference on Solid State Devices and Materials*", 152–153, 1999. In the modified method, instead of oxidizing silicon with atomic oxygen generated in the high-frequency krypton plasma at about 400° C., a thin film of Zr is first deposited on the silicon substrate by simple thermal evaporation, preferably using electron-beam evaporation of an ultra high purity Zr metal slug at a low temperature of about 150–200° C. This forms a thin film of Zr on the silicon while maintaining an atomically smooth surface. After forming the layer of Zr metal, it is oxidized to $ZrO_2$ using the high frequency krypton plasma at about 300–500° C.

Still another and more preferred method for forming the $ZrO_2$ layer 14 in other embodiments, is to use reaction sequence atomic layer deposition (RS-ALD) of a $ZrI_4$ precursor followed by deposition of oxygen reactants in multiple cycles to sequentially grow the $ZrO_2$ layer as described, for example, by Kukli et al., *J. of the Electochemical Soc.*, 148 (12) F227–F232, 2001. In this method, the silicon substrate is first etched by treatment with about 5% HF to remove any native $SiO_2$ formed on the surface. The etched substrate is then placed in an RS-ALD reaction vessel along with an open reservoir containing the $ZrI_4$ precursor. The pressure in the reaction ALD reaction vessel is lowered to a value of about 250 Pa or lower for one or more pulse periods of about 0.5 to 5 seconds. A pressure of about 250 Pa is a suitable pressure for evaporating the $ZrI_4$ and a pulse of about 0.5–2 seconds is sufficient to deposit a layer of about 0.5 to 5 angstroms per cycle. The temperature in the reaction vessel is typically maintained between about 230 and 325° C. Oxygen is then supplied by a vapor of an $H_2O$—$H_2O_2$ precursor generated form an external reservoir at room temperature. The oxygen precursor material is passed into the ALD reaction vessel after each $ZrI_4$ evaporative precursor pulse for a period of about 2 seconds or less.

Between each $ZrI_4$ evaporation pulse and oxygen pulse and between each oxygen pulse and the next evaporative pulse, the reaction vessel is purged with a suitable carrier gas, such as nitrogen or a noble gas, to separate the precursors flows in the gas phase and remove excess reactants and by-products from the system. A suitable purge time for efficiency is about 2 seconds or less. Approximately 6 to 50, and typically about 10–20 evaporative cycles of 2 seconds in duration at a temperature of about 230 to 600° C. is suitable for forming a $ZrO_2$ oxide layer of about to 2 to about 5 nm in thickness. In various embodiments, temperatures of about 230° C. to 350° C., 272–325° C. or 272–275° C. are used because less residual iodine remains in the final layers and these temperatures lead to better quality oxides having a cubic $ZrO_2$ lattice structure at the silicon/$ZrO_2$ interface only giving way to a tetragonal lattice structure with increasing layer thickness. Temperatures greater than about 350° C. tend to form films with more t-$ZrO_2$ structure and reduced capacitance. The permittivity of a $ZrO_2$ layer of 2 to 5 nm in thickness made the foregoing method is about 2–8 at 100 kHz and has an EOT of about 0.3 to about 2.4 nm.

Figure 5:
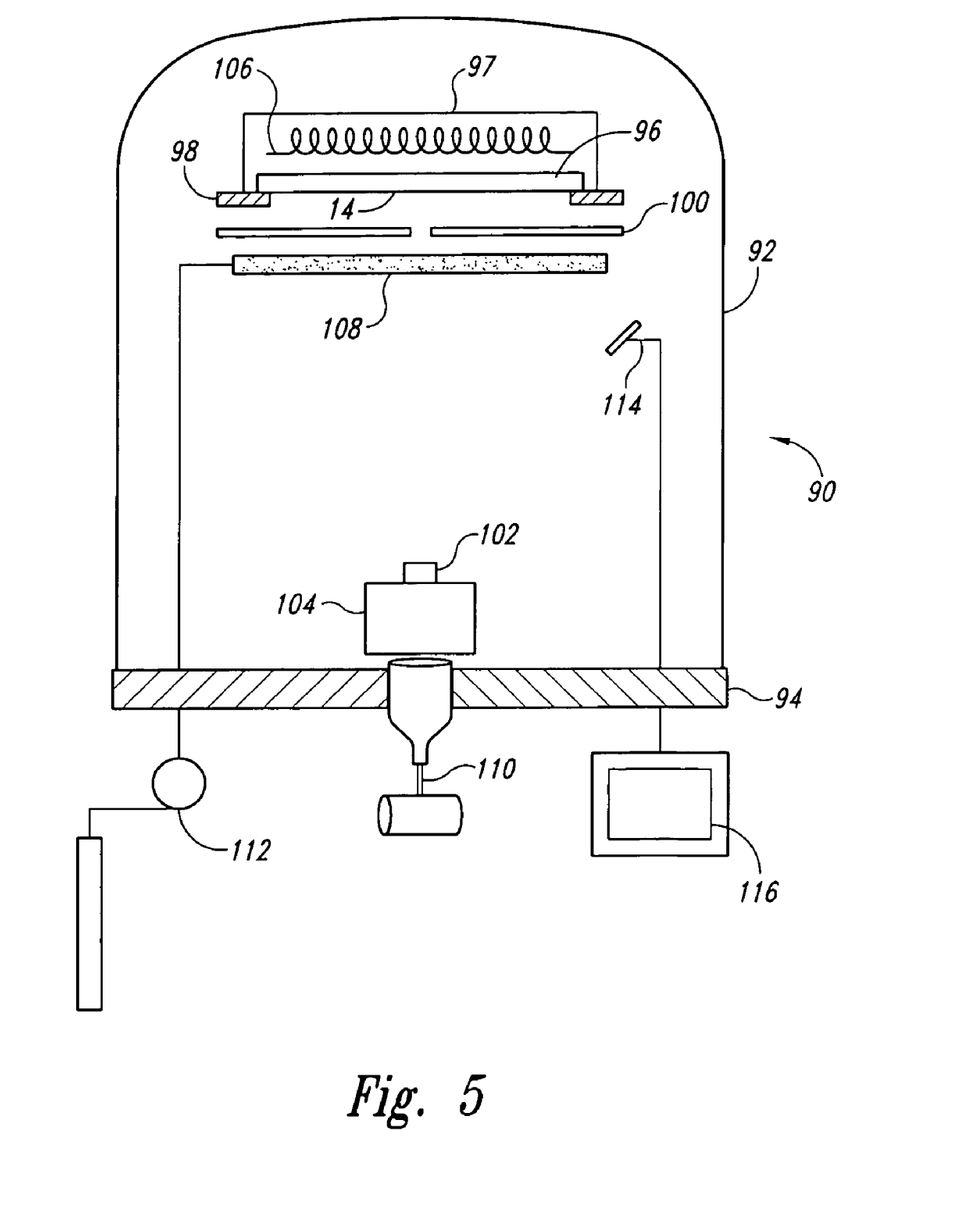
FIG. 5 illustrates an e-beam evaporation vessel for forming at least one of the lanthanide oxide layer or $ZrO_2$ layers that form the transistor the laminate dielectric layer according to another embodiment of the invention.

Once the $ZrO_2$ layer 14 is deposited, the lanthanide oxide layer 16 is deposited thereon by any suitable technique. A preferred technique for depositing the lanthanide oxide layer is e-beam evaporation. FIG. 5 illustrates an e-beam evaporator chamber 90 suitable for forming the lanthanide oxide layer 16 (or in certain embodiments, for forming a Zr precursor layer) according to the invention. The e-beam evaporator includes a removable chamber vessel 92 made of metal, quartz or other suitable high temperature tolerant material. The chamber vessel is located on top of a base plate 94. The substrate 96, optionally with a previously deposited layer of $ZrO_2$ 14, is held in a substrate support device 98 with the target surface facing a shutter 100 that controls exposure of the substrate surface to the beam of evaporated lanthanide oxide 102 emitted by bombardment from an electron gun 104 situated in the lower part of the chamber below the shutter 100.

The temperature of the substrate 96 and chamber environment is controlled by a heater 106 assembly that may include an optional reflector 97 in proximity to the substrate 96. The temperature in the chamber is raised to about 200° C. to ensure efficient e-beam evaporation and deposition of the lanthanide oxide 102. An oxygen distribution ring 108 is located below the shutter 100. The oxygen distribution ring is a manifold that distributes oxygen around the surface of the substrate 96 at final pressure of about $10^{-7}$ Torr. The electron beam evaporation chamber 90 is configured with a vacuum pump 110 for evacuating the chamber to a pressure of about $10^{-6}$ Torr or less. Oxygen pressure in the chamber is regulated by oxygen control regulator 112. A small amount of oxygen is needed in the chamber to ensure that the deposited layer of lanthanide oxide is completely oxidized because the process of e-beam evaporation tends to degrade the oxidation stoichiometry of the lanthanide oxide material 102. Optional detectors or monitors may be included on the interior or exterior of the chamber 90, such as an interiorly situated detector 114 for detecting the thickness of the layer and the exteriorly situated monitor 116 for displaying the thickness of the layer. The lanthanide oxide layer 16 is formed to a suitable thickness of 2–10 nm on the surface of the substrate or $ZrO_2$ layer 14 by controlling the duration of electron beam evaporation.

From the foregoing it will be appreciated that, although specific embodiments of the invention have been described herein for purposes of illustration, various modifications may be made without deviating from the spirit and scope of the invention. Accordingly, the invention is not limited except as by the following claims.

What is claimed is:

1. A semiconductor structure comprising:
   a substrate material and a composite laminate dielectric layer formed on the substrate material, the composite laminate dielectric layer comprising;
   a layer of $ZrO_2$; and
   a layer of a lanthanide oxide having a thickness of about 2–12 nm on the $ZrO_2$ layer.

2. The semiconductor structure of claim 1 wherein the lanthanide oxide is selected from the group consisting of $Pr_2O_3$, $Nd_2O_3$, $Sm_2O_3$, $Gd_2O_3$, $Dy_2O_3$ and PrTixOy.

3. The semiconductor structure of claim 1 wherein the composite laminate dielectric layer is a gate dielectric layer of a transistor.

4. The semiconductor structure of claim 3 wherein the transistor is a component of a DRAM.

5. The semiconductor structure of claim 1 wherein the composite laminate dielectric layer is a dielectric layer of a capacitor.

6. The semiconductor structure of claim 5 wherein the capacitor is a component of a DRAM.

7. The semiconductor structure of claim 1 wherein the composite laminate dielectric layer has a dielectric constant between about 12 and about 23.

8. The semiconductor structure of claim 1 wherein the $ZrO_2$ layer has a thickness of about 1–6 nm.

9. The semiconductor structure of claim 1 wherein the composite laminate dielectric layer has a thickness of about 3–18 nm.

10. The semiconductor device of claim 1 wherein the $ZrO_2$ layer is formed by atomic layer deposition from a $ZrI_4$ precursor followed by oxidation with $H_2O/H_2O_2$.

11. The semiconductor device of claim 1 wherein the lanthanide oxide layer is formed by electron beam evaporation of a lanthanide oxide.

12. A semiconductor transistor comprising:
    a gate electrode;
    a source region and a drain region; and
    a gate dielectric layer beneath the gate electrode and between the source and the drain regions, the dielectric layer being a composite laminate dielectric layer comprising a first layer of $ZrO_2$ having a thickness of about 2–5 nm, and a second layer of lanthanide oxide.

13. The semiconductor transistor of claim 12 wherein the composite laminate dielectric layer has a dielectric constant between about 12 and about 23.

14. The semiconductor transistor of claim 12 wherein the lanthanide oxide layer has a thickness of about 2–12 nm.

15. The semiconductor transistor of claim 12 wherein the composite laminate dielectric layer has a thickness of about 3–18 nm.

16. The semiconductor transistor of claim 12 wherein the $ZrO_2$ layer is formed by atomic layer deposition from a $ZrI_4$ precursor followed by oxidation with $H_2O/H_2O_2$.

17. The semiconductor transistor of claim 12 wherein the lanthanide oxide layer is formed by electron beam evaporation of a lanthanide oxide.

18. The semiconductor transistor of claim 12 wherein the lanthanide oxide is selected from the group consisting of $Pr_2O_3$, $Nd_2O_3$, $Sm_2O_3$, $Gd_2O_3$, $Dy_2O_3$ and PrTixOy.

19. A semiconductor capacitor comprising:
    a first electrode;
    a second electrode, and
    a dielectric layer separating the first and the second electrodes, the dielectric layer being a composite laminate dielectric layer comprising a first layer of $ZrO_2$ having a thickness of about 1–2 nm, and a second layer of lanthanide oxide.

20. The semiconductor capacitor of claim 19 wherein the composite laminate dielectric layer has a dielectric constant between about 12 and about 23.

21. The semiconductor capacitor of claim 19 wherein the $ZrO_2$ layer has a thickness of about 1–6 nm.

22. The semiconductor capacitor of claim 19 wherein the $ZrO_2$ layer has a thickness of about 3 nm.

23. The semiconductor capacitor of claim 19 wherein the lanthanide oxide layer has a thickness of about 2–4 nm.

24. The semiconductor capacitor of claim 19 wherein the lanthanide oxide layer has a thickness of about 3 nm.

25. The semiconductor capacitor of claim 19 wherein the composite laminate dielectric layer has a thickness of about 9 nm.

26. The semiconductor capacitor of claim 19 wherein the $ZrO_2$ layer is formed by atomic layer deposition from a $ZrI_4$ precursor followed by oxidation with $H_2O/H_2O_2$.

27. The semiconductor capacitor of claim 19 wherein the lanthanide oxide layer is formed by electron beam evaporation of a lanthanide oxide.

28. The semiconductor capacitor of claim 19 wherein the lanthanide oxide is selected from the group consisting of $Pr_2O_3$, $Nd_2O_3$, $Sm_2O_3$, $Gd_2O_3$, $Dy_2O_3$ and PrTixOy.

29. A semiconductor memory device comprising:
    a capacitor that includes a first dielectric material separating a first and a second electrode; a transistor that includes a second dielectric material beneath a gate electrode and between a source and a drain region, and
    at least one of the first and second dielectric materials is a composite laminate dielectric layer comprised of a first layer of material selected from the group consisting of $ZrO_2$ and lanthanide oxide and a second layer of material selected from the group consisting of $ZrO_2$ and a lanthanide oxide on the first layer of material, the second layer of material being different from the first layer of material, wherein the lanthanide oxide layer has a thickness of about 2–12 nm.

30. The semiconductor memory device of claim 29 wherein the lanthanide oxide is selected from the group consisting of $Pr_2O_3$, $Nd_2O_3$, $Sm_2O_3$, $Gd_2O_3$, $Dy_2O_3$ and PrTixOy.

31. The semiconductor memory device of claim 29 wherein the first dielectric material is comprised of the composite laminate dielectric layer.

32. The semiconductor memory device of claim 29 wherein the second dielectric material is comprised of the composite laminate dielectric layer.

33. The semiconductor memory device of claim 29 wherein each of the first and the second dielectric material is comprised of the composite laminate dielectric layer.

34. The semiconductor memory device of claim 29 wherein the device is a DRAM.

35. The semiconductor memory device of claim 29 wherein the composite laminate dielectric layer has a dielectric constant between about 12 and about 23.

36. The semiconductor memory device of claim 29 wherein the $ZrO_2$ layer has a thickness of about 1–6 nm.

37. The semiconductor memory device of claim 29 wherein the composite laminate dielectric layer has a thickness of about 3–18 nm.

38. A semiconductor structure comprising:
a substrate material and a composite laminate dielectric layer having a thickness of about 3–18 nm formed on the substrate material, the composite laminate dielectric layer comprising;
a layer of $ZrO_2$ having a thickness of about 1–6 nm; and
a layer of a lanthanide oxide on the $ZrO_2$ layer.

39. The semiconductor structure of claim 38 wherein the lanthanide oxide is selected from the group consisting of $Pr_2O_3$, $Nd_2O_3$, $Sm_2O_3$, $Gd_2O_3$, $Dy_2O_3$ and PrTixOy.

40. The semiconductor structure of claim 38 wherein the composite laminate dielectric layer is a gate dielectric layer of a transistor.

41. The semiconductor structure of claim 40 wherein the transistor is a component of a DRAM.

42. The semiconductor structure of claim 38 wherein the composite laminate dielectric layer is a dielectric layer of a capacitor.

43. The semiconductor structure of claim 42 wherein the capacitor is a component of a DRAM.

44. The semiconductor structure of claim 38 wherein the composite laminate dielectric layer has a dielectric constant between about 12 and about 23.

45. The semiconductor structure of claim 38 wherein the lanthanide oxide layer has a thickness of about 2–12 nm.

46. The semiconductor device of claim 38 wherein the $ZrO_2$ layer is formed by atomic layer deposition from a $ZrI_4$ precursor followed by oxidation with $H_2O/H_2O_2$.

47. The semiconductor device of claim 38 wherein the lanthanide oxide layer is formed by electron beam evaporation of a lanthanide oxide.

48. A semiconductor transistor comprising:
a gate electrode;
a source region and a drain region; and
a gate dielectric layer beneath the gate electrode and between the source and the drain regions, the dielectric layer being a composite laminate dielectric layer comprising a first layer of $ZrO_2$ and a second layer of lanthanide oxide having a thickness of about 2–12 nm.

49. The semiconductor transistor of claim 48 wherein the composite laminate dielectric layer has a dielectric constant between about 12 and about 23.

50. The semiconductor transistor of claim 48 wherein the $ZrO_2$ layer has a thickness of about 2–5 nm.

51. The semiconductor transistor of claim 48 wherein the composite laminate dielectric layer has a thickness of about 3–18 nm.

52. The semiconductor transistor of claim 48 wherein the $ZrO_2$ layer is formed by atomic layer deposition from a $ZrI_4$ precursor followed by oxidation with $H_2O/H_2O_2$.

53. The semiconductor transistor of claim 48 wherein the lanthanide oxide layer is formed by electron beam evaporation of a lanthanide oxide.

54. The semiconductor transistor of claim 48 wherein the lanthanide oxide is selected from the group consisting of $Pr_2O_3$, $Nd_2O_3$, $Sm_2O_3$, $Gd_2O_3$, $Dy_2O_3$ and PrTixOy.

55. A semiconductor transistor comprising:
a gate electrode;
a source region and a drain region; and
a gate dielectric layer beneath the gate electrode and between the source and the drain regions, the dielectric layer being a composite laminate dielectric layer having a thickness of about 3–18 nm comprising a first layer of $ZrO_2$ having a thickness of about 2–5 nm and a second layer of lanthanide oxide.

56. The semiconductor transistor of claim 55 wherein the composite laminate dielectric layer has a dielectric constant between about 12 and about 23.

57. The semiconductor transistor of claim 55 wherein the lanthanide oxide layer has a thickness of about 2–12 nm.

58. The semiconductor transistor of claim 55 wherein the $ZrO_2$ layer is formed by atomic layer deposition from a $ZrI_4$ precursor followed by oxidation with $H_2O/H_2O_2$.

59. The semiconductor transistor of claim 55 wherein the lanthanide oxide layer is formed by electron beam evaporation of a lanthanide oxide.

60. The semiconductor transistor of claim 55 wherein the lanthanide oxide is selected from the group consisting of $Pr_2O_3$, $Nd_2O_3$, $Sm_2O_3$, $Gd_2O_3$, $Dy_2O_3$ and PrTixOy.

61. A semiconductor capacitor comprising:
a first electrode;
a second electrode, and
a dielectric layer separating the first and the second electrodes, the dielectric layer being a composite laminate dielectric layer comprising a first layer of $ZrO_2$ and a second layer of lanthanide oxide having a thickness of about 2–4 nm.

62. The semiconductor capacitor of claim 61 wherein the composite laminate dielectric layer has a dielectric constant between about 12 and about 23.

63. The semiconductor capacitor of claim 61 wherein the $ZrO_2$ layer has a thickness of about 1–6 nm.

64. The semiconductor capacitor of claim 61 wherein the $ZrO_2$ layer has a thickness of about 1–2 nm.

65. The semiconductor capacitor of claim 61 wherein the $ZrO_2$ layer has a thickness of about 3 nm.

66. The semiconductor capacitor of claim 61 wherein the lanthanide oxide layer has a thickness of about 3 nm.

67. The semiconductor capacitor of claim 61 wherein the composite laminate dielectric layer has a thickness of about 9 nm.

68. The semiconductor capacitor of claim 61 wherein the $ZrO_2$ layer is formed by atomic layer deposition from a $ZrI_4$ precursor followed by oxidation with $H_2O/H_2O_2$.

69. The semiconductor capacitor of claim 61 wherein the lanthanide oxide layer is formed by electron beam evaporation of a lanthanide oxide.

70. The semiconductor capacitor of claim 61 wherein the lanthanide oxide is selected from the group consisting of $Pr_2O_3$, $Nd_2O_3$, $Sm_2O_3$, $Gd_2O_3$, $Dy_2O_3$ and PrTixOy.

71. A semiconductor capacitor comprising:
a first electrode;
a second electrode, and
a dielectric layer separating the first and the second electrodes, the dielectric layer being a composite laminate dielectric layer having a thickness of about 9 nm comprising a first layer of $ZrO_2$ having a thickness of about 1–6 nm and a second layer of lanthanide oxide.

72. The semiconductor capacitor of claim 71 wherein the composite laminate dielectric layer has a dielectric constant between about 12 and about 23.

73. The semiconductor capacitor of claim 71 wherein the $ZrO_2$ layer has a thickness of about 1–2 nm.

74. The semiconductor capacitor of claim 71 wherein the $ZrO_2$ layer has a thickness of about 3 nm.

75. The semiconductor capacitor of claim 71 wherein the lanthanide oxide layer has a thickness of about 2–4 nm.

76. The semiconductor capacitor of claim 71 wherein the lanthanide oxide layer has a thickness of about 3 nm.

77. The semiconductor capacitor of claim 71 wherein the $ZrO_2$ layer is formed by atomic layer deposition from a $ZrI_4$ precursor followed by oxidation with $H_2O/H_2O_2$.

78. The semiconductor capacitor of claim 71 wherein the lanthanide oxide layer is formed by electron beam evaporation of a lanthanide oxide.

79. The semiconductor capacitor of claim 71 wherein the lanthanide oxide is selected from the group consisting of $Pr_2O_3$, $Nd_2O_3$, $Sm_2O_3$, $Gd_2O_3$, $Dy_2O_3$ and PrTixOy.

80. A semiconductor memory device comprising:
a capacitor that includes a first dielectric material separating a first and a second electrode;
a transistor that includes a second dielectric material beneath a gate electrode and between a source and a drain region, and
at least one of the first and second dielectric materials is a composite laminate dielectric layer having a thickness of about 3–18 nm comprised of a first layer of material selected from the group consisting of $ZrO_2$ and lanthanide oxide and a second layer of material selected from the group consisting of $ZrO_2$ and a lanthanide oxide on the first layer of material, the second layer of material being different from the first layer of material, wherein the $ZrO_2$ layer has a thickness of about 1–6 nm.

81. The semiconductor memory device of claim 80 wherein the lanthanide oxide is selected from the group consisting of $Pr_2O_3$, $Nd_2O_3$, $Sm_2O_3$, $Gd_2O_3$, $Dy_2O_3$ and PrTixOy.

82. The semiconductor memory device of claim 80 wherein the first dielectric material is comprised of the composite laminate dielectric layer.

83. The semiconductor memory device of claim 80 wherein the second dielectric material is comprised of the composite laminate dielectric layer.

84. The semiconductor memory device of claim 80 wherein each of the first and the second dielectric material is comprised of the composite laminate dielectric layer.

85. The semiconductor memory device of claim 80 wherein the device is a DRAM.

86. The semiconductor memory device of claim 80 wherein the composite laminate dielectric layer has a dielectric constant between about 12 and about 23.

87. The semiconductor memory device of claim 80 wherein the lanthanide oxide layer has a thickness of about 2–12 nm.

88. A semiconductor structure comprising:
a substrate material and a composite laminate dielectric layer having a thickness of about 3–18 nm formed on the substrate material, the composite laminate dielectric layer comprising;
a layer of $ZrO_2$; and
a layer of a lanthanide oxide on the $ZrO_2$ layer, wherein the lanthanide oxide layer has a thickness of about 2–12 nm.

89. The semiconductor structure of claim 88 wherein the lanthanide oxide is selected from the group consisting of $Pr_2O_3$, $Nd_2O_3$, $Sm_2O_3$, $Gd_2O_3$, $Dy_2O_3$ and PrTixOy.

90. The semiconductor structure of claim 88 wherein the composite laminate dielectric layer is a gate dielectric layer of a transistor.

91. The semiconductor structure of claim 90 wherein the transistor is a component of a DRAM.

92. The semiconductor structure of claim 88 wherein the composite laminate dielectric layer is a dielectric layer of a capacitor.

93. The semiconductor structure of claim 92 wherein the capacitor is a component of a DRAM.

94. The semiconductor structure of claim 88 wherein the composite laminate dielectric layer has a dielectric constant between about 12 and about 23.

95. The semiconductor structure of claim 88 wherein the $ZrO_2$ layer has a thickness of about 1–6 nm.

96. The semiconductor device of claim 88 wherein the $ZrO_2$ layer is formed by atomic layer deposition from a $ZrI_4$ precursor followed by oxidation with $H_2O/H_2O_2$.

97. The semiconductor device of claim 88 wherein the lanthanide oxide layer is formed by electron beam evaporation of a lanthanide oxide.

98. A semiconductor transistor comprising:
a gate electrode;
a source region and a drain region; and
a gate dielectric layer beneath the gate electrode and between the source and the drain regions, the dielectric layer being a composite laminate dielectric layer having a thickness of about 3–18 nm comprising a first layer of $ZrO_2$ and a second layer of lanthanide oxide having a thickness of about 2–12 nm.

99. The semiconductor transistor of claim 98 wherein the composite laminate dielectric layer has a dielectric constant between about 12 and about 23.

100. The semiconductor transistor of claim 98 wherein the $ZrO_2$ layer has a thickness of about 2–5 nm.

101. The semiconductor transistor of claim 98 wherein the $ZrO_2$ layer is formed by atomic layer deposition from a $ZrI_4$ precursor followed by oxidation with $H_2O/H_2O_2$.

102. The semiconductor transistor of claim 98 wherein the lanthanide oxide layer is formed by electron beam evaporation of a lanthanide oxide.

103. The semiconductor transistor of claim 98 wherein the lanthanide oxide is selected from the group consisting of $Pr_2O_3$, $Nd_2O_3$, $Sm_2O_3$, $Gd_2O_3$, $Dy_2O_3$ and PrTixOy.

104. A semiconductor capacitor comprising:
a first electrode;
a second electrode, and
a dielectric layer separating the first and the second electrodes, the dielectric layer being a composite laminate dielectric layer having a thickness of about 9 nm comprising a first layer of $ZrO_2$ and a second layer of lanthanide oxide having a thickness of about 2–4 nm.

105. The semiconductor capacitor of claim 104 wherein the composite laminate dielectric layer has a dielectric constant between about 12 and about 23.

106. The semiconductor capacitor of claim 104 wherein the $ZrO_2$ layer has a thickness of about 1–6 nm.

107. The semiconductor capacitor of claim 104 wherein the $ZrO_2$ layer has a thickness of about 1–2 nm.

108. The semiconductor capacitor of claim 104 wherein the $ZrO_2$ layer has a thickness of about 3 nm.

109. The semiconductor capacitor of claim 104 wherein the lanthanide oxide layer has a thickness of about 3 nm.

110. The semiconductor capacitor of claim 104 wherein the $ZrO_2$ layer is formed by atomic layer deposition from a $ZrI_4$ precursor followed by oxidation with $H_2O/H_2O_2$.

111. The semiconductor capacitor of claim 104 wherein the lanthanide oxide layer is formed by electron beam evaporation of a lanthanide oxide.

112. The semiconductor capacitor of claim 104 wherein the lanthanide oxide is selected from the group consisting of $Pr_2O_3$, $Nd_2O_3$, $Sm_2O_3$, $Gd_2O_3$, $Dy_2O_3$ and PrTixOy.

113. A semiconductor memory device comprising:
   a capacitor that includes a first dielectric material separating a first and a second electrode;
   a transistor that includes a second dielectric material beneath a gate electrode and between a source and a drain region, and
   at least one of the first and second dielectric materials is a composite laminate dielectric layer having a thickness of about 3–18 nm comprised of a first layer of material selected from the group consisting of $ZrO_2$ and lanthanide oxide and a second layer of material selected from the group consisting of $ZrO_2$ and a lanthanide oxide on the first layer of material, the second layer of material being different from the first layer of material, wherein the lanthanide oxide layer has a thickness of about 2–12 nm.

114. The semiconductor memory device of claim 113 wherein the lanthanide oxide is selected from the group consisting of $Pr_2O_3$, $Nd_2O_3$, $Sm_2O_3$, $Gd_2O_3$, $Dy_2O_3$ and PrTixOy.

115. The semiconductor memory device of claim 113 wherein the first dielectric material is comprised of the composite laminate dielectric layer.

116. The semiconductor memory device of claim 113 wherein the second dielectric material is comprised of the composite laminate dielectric layer.

117. The semiconductor memory device of claim 113 wherein each of the first and the second dielectric material is comprised of the composite laminate dielectric layer.

118. The semiconductor memory device of claim 113 wherein the device is a DRAM.

119. The semiconductor memory device of claim 113 wherein the composite laminate dielectric layer has a dielectric constant between about 12 and about 23.

120. The semiconductor memory device of claim 113 wherein the $ZrO_2$ layer has a thickness of about 1–6 nm.

* * * * *